(12) United States Patent
Lee et al.

(10) Patent No.: US 8,868,362 B2
(45) Date of Patent: Oct. 21, 2014

(54) ELECTRIC POWER METERING ACCURACY

(75) Inventors: Dong Hun Lee, Seoul (KR); Dong Soo Shin, Seoul (KR); Sung Dong Yang, Seoul (KR); Young Han Choi, Seoul (KR); Jae Seok Noh, Seoul (KR)

(73) Assignee: General Electric Company, Schenectady, NY (US)

( * ) Notice: Subject to any disclaimer, the term of this patent is extended or adjusted under 35 U.S.C. 154(b) by 449 days.

(21) Appl. No.: 13/344,994

(22) Filed: Jan. 6, 2012

(65) Prior Publication Data

US 2013/0179101 A1    Jul. 11, 2013

(51) Int. Cl.
*G01R 21/00* (2006.01)
*G01R 21/06* (2006.01)

(52) U.S. Cl.
USPC ............... 702/61; 702/62; 702/188; 702/189

(58) Field of Classification Search
CPC .. G01R 21/00; G01R 21/133; G01R 19/2513; G01R 21/06
USPC ...................... 702/61, 62, 182–190
See application file for complete search history.

(56) References Cited

U.S. PATENT DOCUMENTS

| | | | |
|---|---|---|---|
| 6,486,652 B1 * | 11/2002 | Ouellette et al. | 324/142 |
| 8,396,821 B2 * | 3/2013 | Kuhns et al. | 706/48 |
| 2007/0033151 A1 * | 2/2007 | Lee, Jr. | 705/412 |

\* cited by examiner

*Primary Examiner* — Phuong Huynh
(74) *Attorney, Agent, or Firm* — Global Patent Operation; Douglas D. Zhang

(57) ABSTRACT

An apparatus and method for monitoring power consumption of an appliance includes a processor in communication with a memory, the memory including program instructions for execution by the processor to determine a first stable power consumption state of the appliance, record a power consumption of the appliance during the first stable power consumption state, determine an unstable power consumption state of the appliance, suspend recording of the power consumption of the appliance during the unstable state, determine a second stable power consumption state of the appliance, resume recording of the power consumption of the appliance when the appliance is in the second stable power consumption state, and estimate a value of a power consumed during the unstable power consumption state as a factor of the recorded power consumption of the appliance during the first stable power consumption state and the second stable power consumption power state.

15 Claims, 6 Drawing Sheets

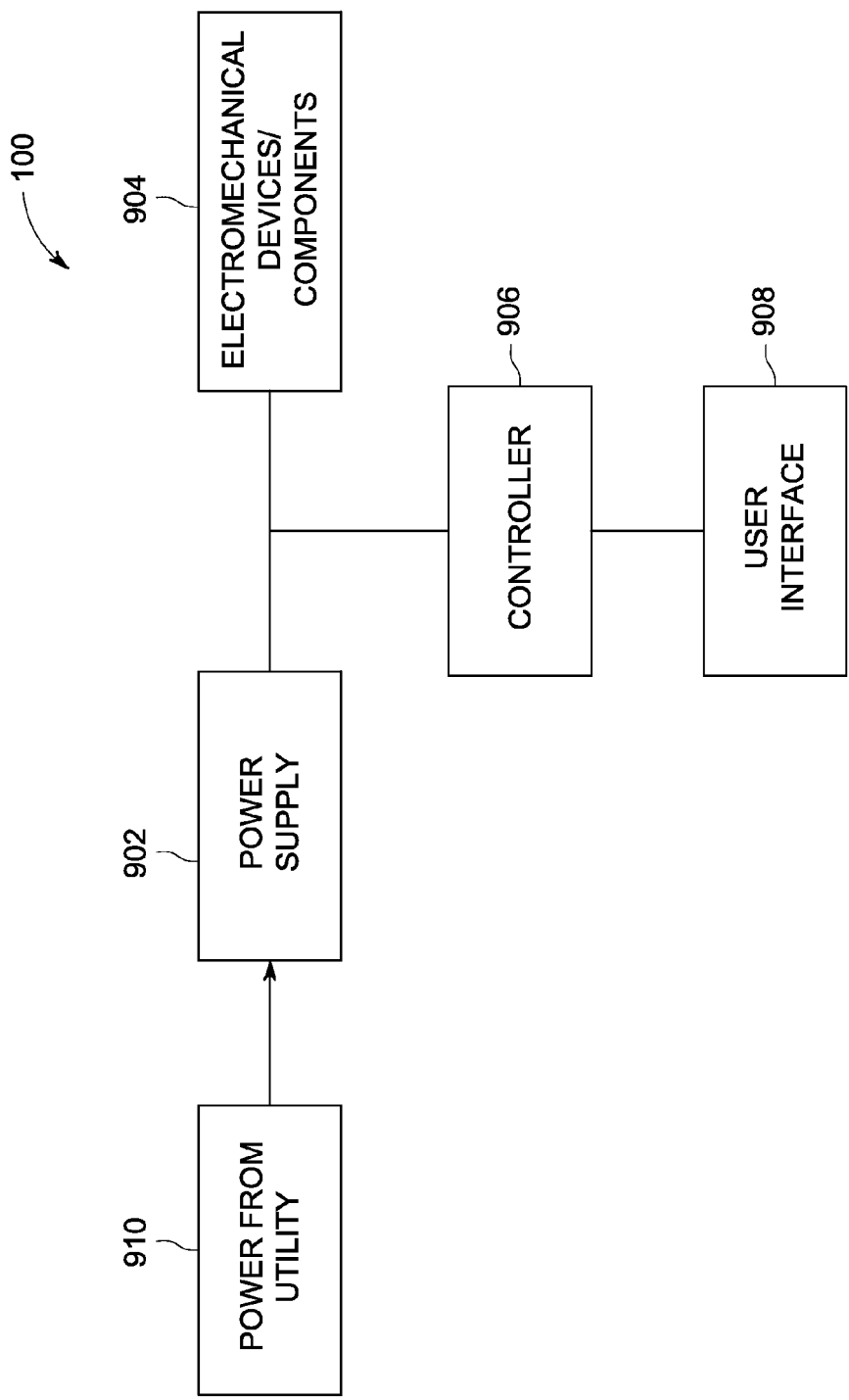

ELECTRIC POWER METERING ACCURACY

BACKGROUND

The present disclosure generally relates to appliances, and more particularly to monitoring power consumption in an appliance.

Appliances will typically have different power consumption states. A stable or steady state is a state in which the rate at which power is consumed is generally steady or constant. An unstable or unsteady state is a state where the power consumption varies, fluctuates or is subject to other transients. For example, in the case of a fan, a stable state is one where the fan is running at a substantially constant speed and power consumption is within a pre-determined range during a given time period. An unstable power consumption state in a fan might be defined as when the speed of the fan is adjusted or changed. When the fan speed is adjusted, there is typically a transition period from the first speed until the second speed is reached. During this transition period, the power consumed by the fan can also vary or fluctuate. A precise measurement of the power consumed during this transition period is difficult to obtain. In some cases, power measuring devices will not measure the power consumed during such transition periods. However, having an understanding of the power consumed with a degree of accuracy during such transition periods can be important when determining the total power consumed by an appliance.

Accordingly, it would be desirable to provide a system that addresses at least some of the problems identified above.

BRIEF DESCRIPTION OF THE DISCLOSED EMBODIMENTS

As described herein, the exemplary embodiments overcome one or more of the above or other disadvantages known in the art.

One aspect of the exemplary embodiments relates to an apparatus for monitoring power consumption of an appliance. In one embodiment, the apparatus includes a processor in communication with a memory, the memory including program instructions for execution by the processor to determine a first stable power consumption state of the appliance, record a power consumption of the appliance during the first stable power consumption state, determine an unstable power consumption state of the appliance, suspend recording of the power consumption of the appliance during the unstable state, determine a second stable power consumption state of the appliance, resume recording of the power consumption of the appliance when the appliance is in the second stable power consumption state, and estimate a value of a power consumed during the unstable power consumption state as a factor of the recorded power consumption of the appliance during the first stable power consumption state and the second stable power consumption power state.

Another aspect of the disclosed embodiments relates to an electrical appliance configured to monitor its power consumption comprising a current sensor for measuring the current supplied to the appliance, a voltage sensor for measuring the voltage applied to the appliance, a controller responsive to the current sensor and the voltage sensor, and operative to process the inputs from the current and voltage sensors to calculate and record the instantaneous power consumption data for the appliance, to repetitively calculate the median and average power values for the power consumption data over a predetermined interval, and calculate the difference between the median and average power values. The controller is further operative to detect a stable power consumption state of the appliance when the difference between the median and average power values is less than a predetermined threshold value; and to detect an unstable power consumption state when the difference between the median and average power values is greater than the predetermined threshold value. The controller suspends recording of the power consumption of the appliance upon detection of an unstable state and resumes recording of the power consumption of the appliance when the appliance returns to a stable power consumption state. The controller estimates the power consumed during the unstable power consumption state as a function of the recorded power consumption of the appliance during the stable power consumption state first preceding the detection of an unstable state and the recorded power consumption of the appliance during the next detected stable power consumption power state.

Another aspect of the disclosed embodiments relates to a method for automatically monitoring power consumption of an appliance. In one embodiment, the method includes determining a first stable power consumption state of the appliance; recording a power consumption of the appliance during the first stable power consumption state; determining an unstable power consumption state of the appliance; suspending recording of the power consumption of the appliance during the unstable state; determining a second stable power consumption state of the appliance; resuming recording of the power consumption of the appliance when the appliance is in the second stable power consumption state; and automatically estimating a value of a power consumed during the unstable power consumption state as a factor of the recorded power consumption of the appliance during the first stable power consumption state and the second stable power consumption power state.

These and other aspects and advantages of the exemplary embodiments will become apparent from the following detailed description considered in conjunction with the accompanying drawings. It is to be understood, however, that the drawings are designed solely for purposes of illustration and not as a definition of the limits of the invention, for which reference should be made to the appended claims. Moreover, the drawings are not necessarily drawn to scale and unless otherwise indicated, they are merely intended to conceptually illustrate the structures and procedures described herein. In addition, any suitable size, shape or type of elements or materials could be used.

BRIEF DESCRIPTION OF THE DRAWINGS

In the drawings:

FIG. 9 is a schematic block diagram of one embodiment of an apparatus in which aspects of the disclosed embodiments can be practiced.

DETAILED DESCRIPTION OF THE
EXEMPLARY EMBODIMENTS OF THE
DISCLOSURE

Figure 1:
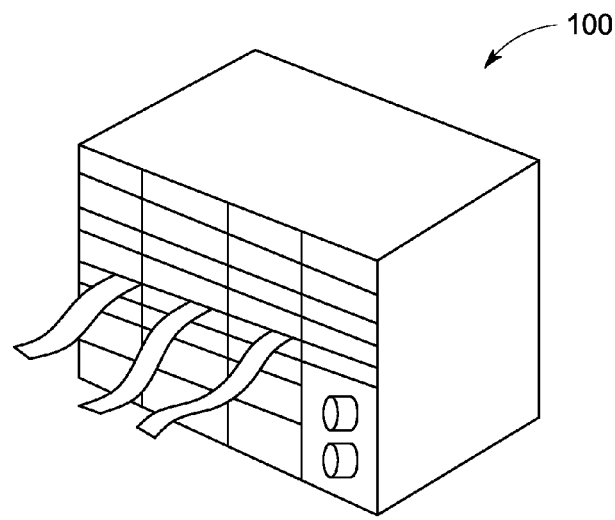
FIG. 1 is a perspective view of an appliance incorporating aspects of the disclosed embodiments.

Referring to FIG. 1, an exemplary appliance, such as an air conditioner, incorporating aspects of the disclosed embodiments, is generally designated by reference numeral 100. The aspects of the disclosed embodiments enhance the accuracy of electric power measurements in an electrically powered appliance by comparing the moving average and moving median of the power consumption data of the appliance 100. In a stable or steady state of power consumption, the moving average power and the moving median power values are converging on each other. The term "stable state" is generally used herein to define a power consumption state where the difference between the moving average and moving median power values falls within a defined or predetermined range over a given time period. In an unstable power consumption state, the moving average power and moving median power values diverge. The term "unstable state" is generally used herein to refer to the state where the difference, or absolute value of the difference between the moving average and moving median power consumption values, fall outside of the defined or pre-determined range over a given time period. During an unstable power consumption state, measured power values may include abnormal samples. For example, a sudden voltage drop or peak due to the change in operational state of the device may lead to incorrect power calculations. However, in order to accurately measure the total power consumed by the appliance 100, the power consumed during the unstable state must be determined because it is a fraction of the total power consumed. Thus, during an unstable power consumption state, the power consumed is indirectly calculated by using the power consumption values measured during the stable states. Although the aspects of the disclosed embodiments will generally be described herein with respect to an electrically powered appliance such as an air conditioner, the aspects of the disclosed embodiments are not so limited, and can include any appliance, electrical or electronic device that is electrically powered or has a transitional power consumption state where the power consumption varies or fluctuates until a stable or steady state is reached. Examples of such devices can include, but are not limited to, fans, motors, printers, ranges, ovens, washers, dryers and refrigerators.

Figure 2:
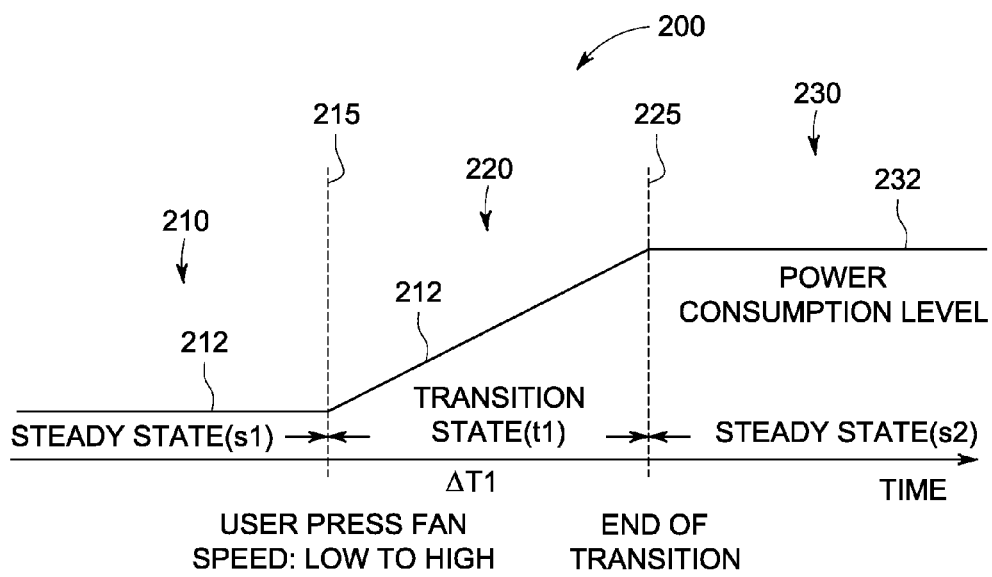
FIG. 2 is a graph illustrating exemplary states of power consumption of the appliance shown in FIG. 1.

FIG. 2 is a graph 200 illustrating exemplary power consumption states for different operational modes of the appliance 100 shown in FIG. 1. As is shown in FIG. 2, the graph 200 includes three states, generally referred to as first state 210, second state 220, and third state 230. The first state 210 in this example is described as steady state (s1). The second state 220 is referred to as transition state (t1) and the third state is referred to as steady state (s2).

In the steady or stable power consumption state, as illustrated by the first state 210 and third state 230, the power being consumed by the appliance 100 is at a substantially constant level, as indicated by lines 212, 232. It is also noted that although the graph 200 illustrates an increase in power consumption levels from the first state 210 to the third state 230, in another embodiment, the power consumption level from the first state 210 to the third state 230 could also be decreasing.

The transition state (t1), such as second state 220, can occur for example when the mode of the appliance 100 is changed, such as from going from a low cool to high cool mode in an air conditioner or if there is a change or interruption in the power supplied to the appliance. Typically, these types of events or mode changes can be accompanied by spikes, surges, drop-offs or other similar transient voltage and power events. In the example shown in FIG. 2, the transition state 220 starts at time reference 215 and lasts until the appliance 100 once again returns to a steady state at time reference 225. As is shown by line 212, during the second state 220, the power consumption of the appliance 100 is changing or varying as the appliance 100 changes state. While the second or transition state 220 appears in FIG. 2 as a linear transition, power consumption values measured during this second state 220 are more likely to include non-linear spikes and dips, or voltage sags and drops. The events generally result from transient voltage or current conditions as the electrical circuit reacts to the changes in operating conditions, or mode changes. During this unstable or transitional time period, it is generally difficult to obtain an accurate measurement of the power consumption of the appliance 100.

Generally, following a transition state, such as t1, the power consumption level will return to a steady state, shown as third state (s2) 230 in FIG. 2. At time reference 225, the power consumption level indicated by line 232 is again at or transitioning to, a substantially constant level.

Figure 3:
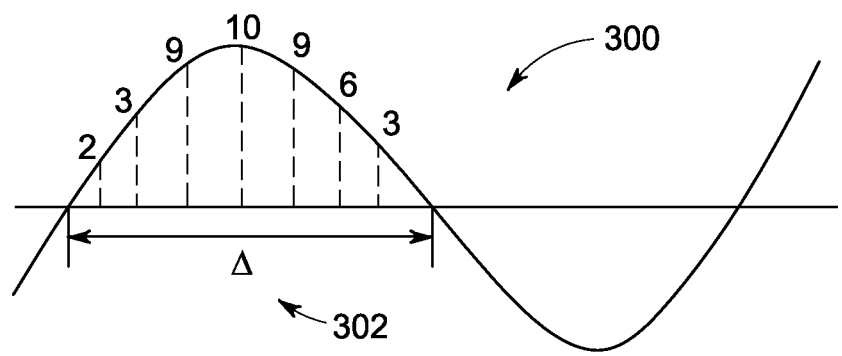
FIG. 3 is a graph illustrating a normal DC power wave during a steady power consumption state of the appliance shown in FIG. 1.
Figure 4:
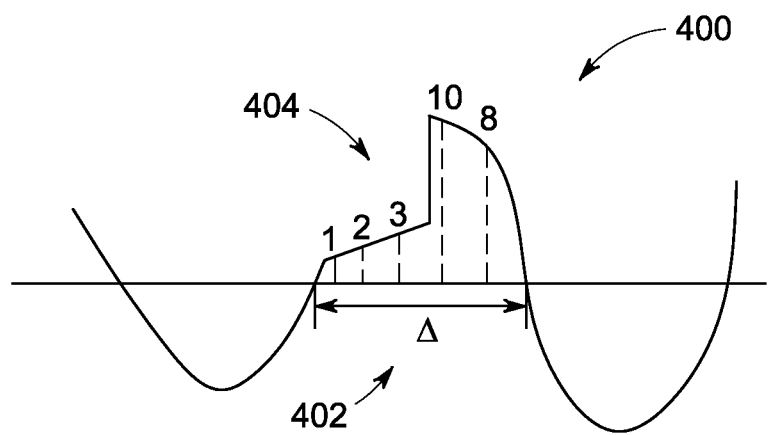
FIG. 4 is a graph illustrating an abnormal DC power wave in an unstable power consumption state of the appliance shown in FIG. 1

Referring to FIG. 3, an exemplary power consumption curve for a stable state is illustrated. FIG. 4 illustrates an exemplary power consumption curve for an unstable state. As shown in FIG. 3, the graph 300 generally represents a normal AC power wave and is represented as a sine curve due to the production of voltage and current. As is described further herein with respect to FIG. 7, the power is calculated as function of the product of voltage and current. The voltage and current measurements can be measured and/or supplied by suitable measurement devices, such as for example, voltmeters, ammeters, wattmeters and/or current transformers. The average power can be determined by measuring the power values at distinct points along the curve 300 over a pre-determined time period or interval Δ, generally indicated by 302. The time interval 302, also referred to herein as the "sampling period" is one cycle of the entire power cycle. The actual time interval can vary depending on the type of device. For example, in the case of an air conditioner, the pre-determined time period can be approximately one (1) second. For a washer, the pre-determined time period might be approximately three (3) seconds.

In this example, seven power measurements are made during the time interval 302, generally indicated by the values 2, 5, 9, 10, 8, 6 and 3. The number of power measurements during the pre-determined time interval 302 is generally referred to the "sampling rate." Although seven power measurements are illustrated in this example, the number of measurement points or sampling rate can vary depending upon the type of device and its properties. The calculated average power is the sum of the measured values divided by the number of measured values. In his example, the average power is calculated as 43/7=6.14. As will be understood, the median power value from the seven measured values in this example is "6". Typically, in a stable power consumption state, the average power and median power values will converge on each other, meaning that the difference between them is small. In this example, the difference between the average power and the median value is 0.14.

The graph 400 shown in FIG. 4 illustrates an abnormal AC power wave. The curve in FIG. 4 is example of power distortion that occurs in the line due to voltage sags, drops, peaks or other transients that can occur with changes in the operational state of the appliance, as is otherwise described herein. In this example, the Δ area or time interval 402 represents a transition state, such as transition state 220 shown in FIG. 2. The abnormal or non-smooth shape of the portion 404 of the graph 400 illustrates a transient condition. The measured values at each of the measurement points, indicated as 1, 2, 3, 10 and 8, generate a calculated average power of 4.8 and a median power of 3. The values are diverging as the difference between the two values is 1.8. In comparison to the difference of 0.14 calculated with respect to the example of FIG. 3, the difference of 1.8 between the average power value and the median power value of FIG. 4 is much higher, and can be indicative of an unstable power consumption state.

In the example shown in FIG. 2, a mode of the appliance 100 is changed at time reference 215. For the purposes of the description herein, the time reference 215 will be described as the beginning of the transition state 220, while the time reference line 225 marks the end of the transition state 220. The time reference 215 may also be referred to as the end of the first stable state 210, while the time reference 225 can be referred to as the beginning of the second stable state 230. In alternate embodiments, the first state 210 can be referred to as the "prior stable state" while the second state 220 can be referred to as the "next" or "subsequent stable state" following a unstable state. The duration of the transition state 220 will be the time interval ΔT1 between time reference 225 and time reference 215. The time interval ΔT1, will typically be on the order of seconds, but could also be shorter or longer time intervals. The slope of the line 212 generally indicates the change in the power consumption, which in this example is increasing over the interval ΔT1. Although the line 212 is shown in FIG. 2 as having an increasing slope, in alternate embodiments the slope of the line 212 can also be decreasing.

The aspects of the disclosed embodiments measure power consumption of the appliance 100 during the stable states, such as the first state 210 and the third state 230 shown in FIG. 2. During an unstable state, such as the second state 220 of FIG. 2, the power consumption of the appliance is not directly measured, but rather calculated or estimated. The aspects of the disclosed embodiments estimate the power consumption of the appliance 100 during the unstable state 220 based on a determination of the average power consumed by the appliance 100 during each of the stable power consumption states before and after the unstable state 220, which in this example are shown as the first and second, stable states 210, 230.

Figure 5:
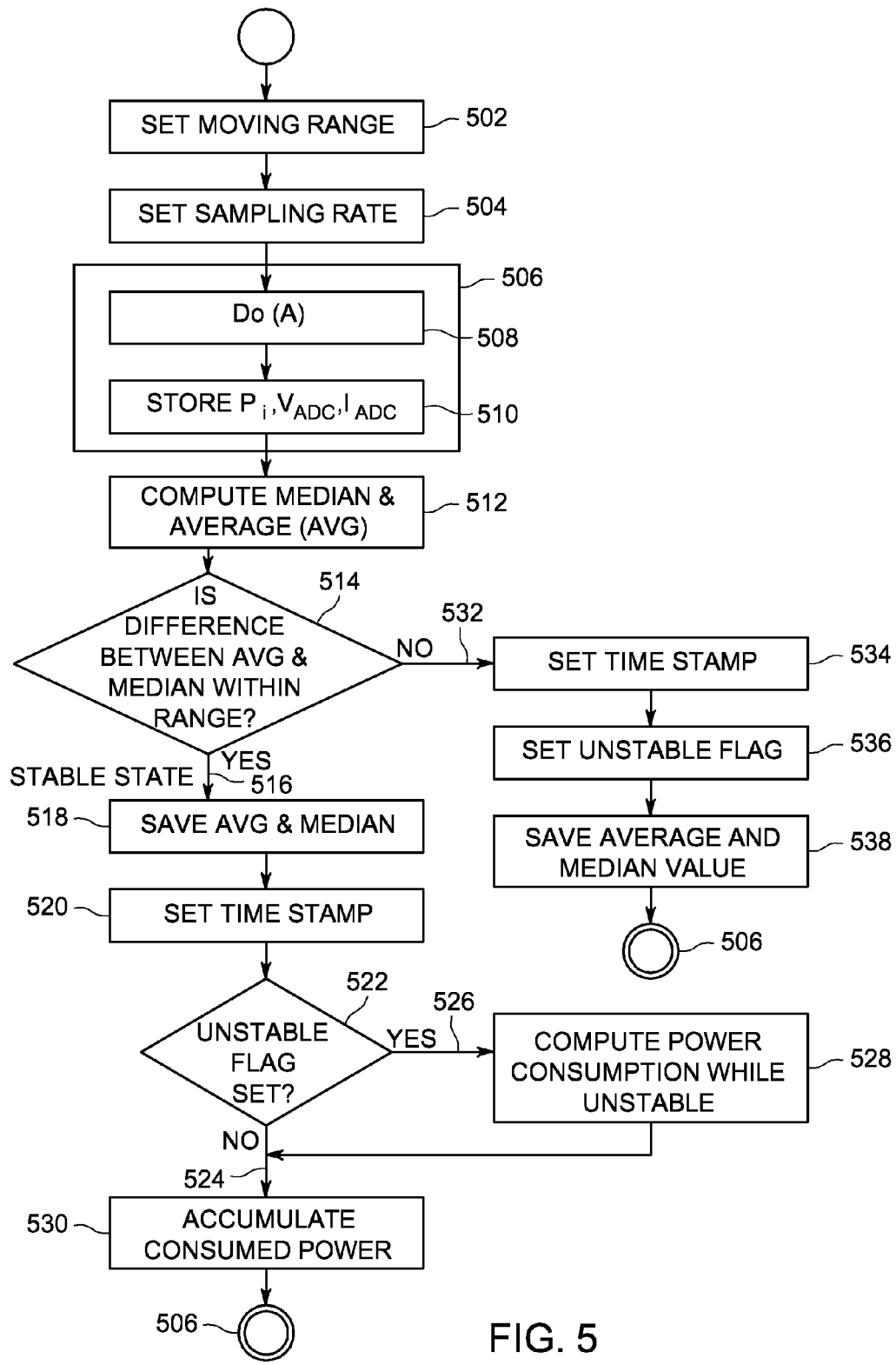
FIG. 5 is a flowchart illustrating one embodiment of a process incorporating aspects of the present disclosure.

FIG. 5 illustrates one embodiment of a process to determine an unstable state and compute the power consumed during this unstable state. In one embodiment, a moving range of the difference values between the average power consumption values and the median power values measured during a stable state is defined 502. The moving range is the relative distance or difference between the moving average and median values. The moving range is determined experimentally, as is the sampling rate 504. For example, the power consumption of the appliance 100 can be measured in each of its different states. For example, in the case of an air conditioner, the states will generally be combinations of the compressor being ON or OFF, and the fan being in a LOW, MEDIUM or HIGH mode, each mode combination defining a different state. By actual experimentation and measurement, it can be determined that for the air conditioner whose compressor is in the ON state and whose fan speed is in the HIG state, the moving average of the power consumption is approximately 800 kW and the median of the power consumption values is distributed in the range of 799.00 kW-801.00 kW. The normal or moving range can be defined as −1.00 kW-1.00 kW. In absolute value terms, the moving range for this exemplary state of compressor ON and fan HIGH is defined as 0.00~1.00. Thus, a determination that a difference between the moving average and the median value is within the range of 0.00~1.00 is an indication of a stable, or normal state, while a difference value that falls outside the range, indicates an unstable, or out of range state. The number of measurements that is used to define the moving range for each different state of the appliance can be any suitable number that provide a generally reliable or consistent result. From the example above, it will be apparent that the moving range will or can be different for each state of an appliance. The moving range can also be different for different types of appliance.

The sampling rate will determine how many points of power consumption measurements, in terms of voltage and current, will be made during a pre-determined time period, such as for example, approximately one (1) second.

The power (P) consumed, generally defined by the equation P=VI, can be calculated 506 from the sampled voltage and current. The aspects of the disclosed embodiments measure the instantaneous voltage and instantaneous current, and multiply those values to calculate the power consumption. An average is then taken of the calculations. The measured values are voltage and current. Each analog voltage level is converted to a digitized voltage level and each analog current level is converted to a digitized current level. The power consumed (P) can then be calculated using the digitized values. In one embodiment, calculating 506 the consumed power ($P_i$) generally includes sampling 508 of the voltage and current values while the power is on. The sampling 508 is iterated over one sampling period and the sampled voltage ($V_{ADC}$) and current ($I_{ADC}$) values are calculated. The power consumption ($P_i$) is determined from the calculated voltage ($V_{ADC}$) and current ($I_{ADC}$) values. The calculated voltage ($V_{ADC}$) and current ($I_{ADC}$) values, together with the calculated power $P_i$, are stored 510.

In one embodiment, once the voltage ($V_{ADC}$) and current ($I_{ADC}$) values have been sampled for one sampling period, the average and median values of the calculated power $P_i$ are determined 512. It is then determined 514 whether the absolute value of the difference between the average and median values of the calculated power $P_i$ are within the moving range. In one embodiment, determining 514 whether the average and median values of the calculated power $P_i$ are within the moving range set comprises determining the difference between the average and median values and comparing the difference to the pre-determined threshold reference value representing the moving range. If yes 516, the average and median values of the calculated power $P_i$ are within the moving range set, which is indicative of a stable power consumption state, such as state 210 in FIG. 2. The average and median values of the calculated power $P_i$ are saved 518. In one embodiment, a time stamp is set 520 to establish a time of the stable state. The time stamp can be used in the estimation of power consumption during an unstable state, as will be further described herein.

Once the time stamp is set 520, the state of the unstable flag is determined 522. The state of the unstable flag is used to determine whether a prior state of the power consumption was stable or unstable. If the unstable flag is not set 524, the prior state of power consumption was a stable state, and the power $P_i$ continues to be accumulated 530 and calculated 506, while the power is on.

If it is determined 514 that the absolute value of a difference between the average and median power values is not 532 within the pre-determined range, this is generally indicative of an unstable power consumption state, as is described above. Once an unstable state is determined, it is determined 534 whether the unstable flag is set. If yes 536, the sampling 506 continues. If no 538, a time stamp is set or recorded 540 and the unstable flag is set 542. The setting 540 of the time stamp indicates the start of the unstable period and will be used to determine the duration of the unstable stamp and the power $P_i$ continues to be sampled and calculated 506. In one embodiment, once an unstable state is determined 532 and the unstable flag is set, the average and median values are no longer stored since the measured values in the unstable state may contain abnormal samples. Rather, in this embodiment, the measured values are used to determine when the power consumption state returns to the stable state.

If it is determined 522 that the unstable flag is set 526 and the current state is a stable state, this indicates that the prior power consumption state was an unstable state. In order to determine total power consumption, the aspects of the disclosed embodiments compute or estimate 528 the power consumption during the unstable state using the average and median power values from the stable states before and after the unstable state.

For example, with reference to FIGS. 2 and 5, it is determined 514 that the power consumption state is stable state 230. Since the prior power consumption state was unstable state 220, the unstable flag is determined 522 to be set 526. The most recent power consumption level from stable state 230 is retrieved 602. The average power value from the stable state just prior to the unstable state 220, first state 210, is retrieved. The time duration of the unstable state is determined from interval between the time stamp 215 indicating the beginning of the unstable state recorded in step 534 to the time stamp 225 recorded in step 520 indicating the end of the unstable state. The power consumption during the unstable state 220 is determined from the sum of the average power value during each of the stable states 210 and 230, divided by the time duration of the unstable state 220.

Figure 6:
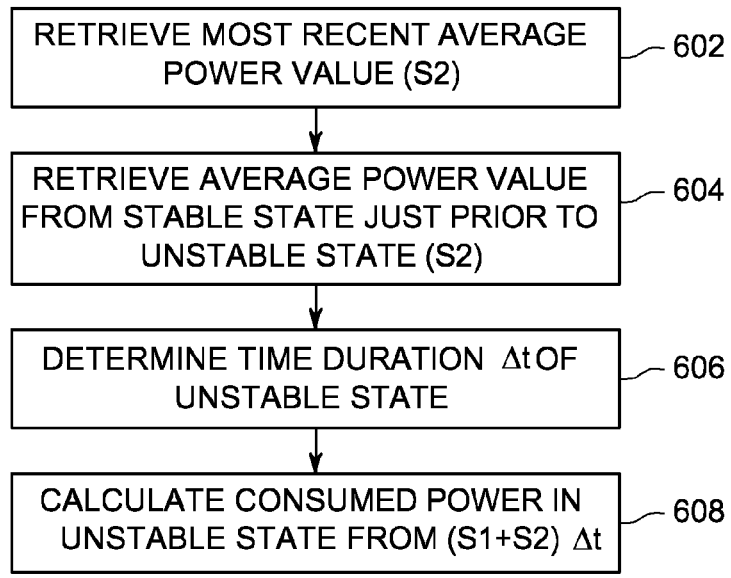
FIG. 6 is a flow chart illustrating one embodiment of calculating power consumed during an unstable state in a process incorporating aspects of the present disclosure.

FIG. 6 illustrates one embodiment of computing 528 the power consumption during the unstable state. The most recent average power value during a stable state, saved in step 518, is retrieved. The average power value that was recorded just prior to the unstable state is retrieved 604. A time duration of the unstable state is determined 606 from the recorded time stamps indicating the beginning and end of the unstable state. The power consumed during the unstable state is determined 608 as the sum of the retrieved average power values divided by the time duration of the unstable state. Experimental results have shown that the power consumption increases in a substantially linear manner during the unstable state. Thus, an average value calculation generally provides a reasonable approximation of power consumption during the unstable state.

Figure 7:
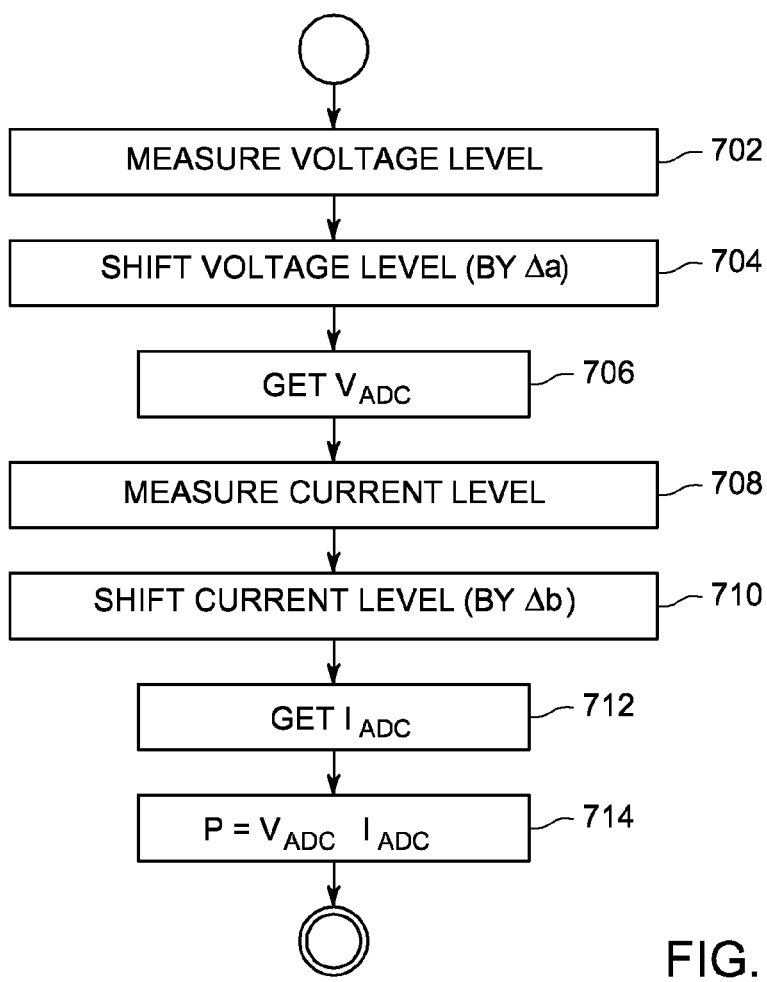
FIG. 7 is a flow chart illustrating one embodiment of sampling and power calculation in a process incorporating aspects of the present disclosure.

FIG. 7 illustrates one embodiment of a process to calculate the voltage ($V_{ADC}$) and current ($I_{ADC}$) and calculate the power ($P_1$) from step 506 in FIG. 5. In one embodiment, the instant voltage level is measured 702. The voltage level measured 702 is shifted 704 by an amount $\Delta a$ to ensure that the measured voltage level is a positive value. The amount $\Delta a$ is typically approximately one-half of the maximum input value specified for the particular device being used for the analog-to-digital (ADC) conversion. Typically, when converting the analog voltage level to the digitized voltage value (analog-to-digital conversion using a microcontroller unit (MCU)), the input value must generally be equal or great than 0. However, in some cases when measuring the voltage level or current level, the measured value can be a negative number. In order for the microcontroller unit to process the measured value, the number must be converted to a positive number for the analog-to-digital conversion. In one embodiment, a shift or offset is applied to the measured value. The amount of the shift, which is generally dependent upon the particular ADC microcontroller that is being used, will typically be approximately one-half of the maximum input value to the ADC microcontroller. For example, if the maximum input value is 1.17 volts, as is common for some types of microprocessor devices, the amount of the shift or offset is approximately 0.58 volts.

The shifted voltage level is converted 706 to a digital voltage value ($V_{ADC}$). The instant current is also measured 708, shifted 710 by an amount $\Delta b$, to ensure that the measured value is a positive number and converted 712 to a digital value ($I_{ADC}$). The power ($P_1$) is then calculated 714 as the product of the values of $V_{ADC}$ and $I_{ADC}$.

In addition to improving power measuring accuracy, the aspects of the disclosed embodiments can also be used to monitor and track voltage and current movement patterns and identify or prevent malfunctions of the appliance 100. For example, if the voltage moves out of the set range on a continuous basis, this can be interpreted to mean that the utility power supply situation is unstable, in which case the appliance 100 might be shut down or otherwise protected from such voltage instability and fluctuations. This can be similarly applied to deviations in current movement. Normally, the average and median values of current will converge on each other during a stable situation. However, if both values move out of the ranges, or diverge, this can indicate a problem with the appliance 100.

Figure 8:
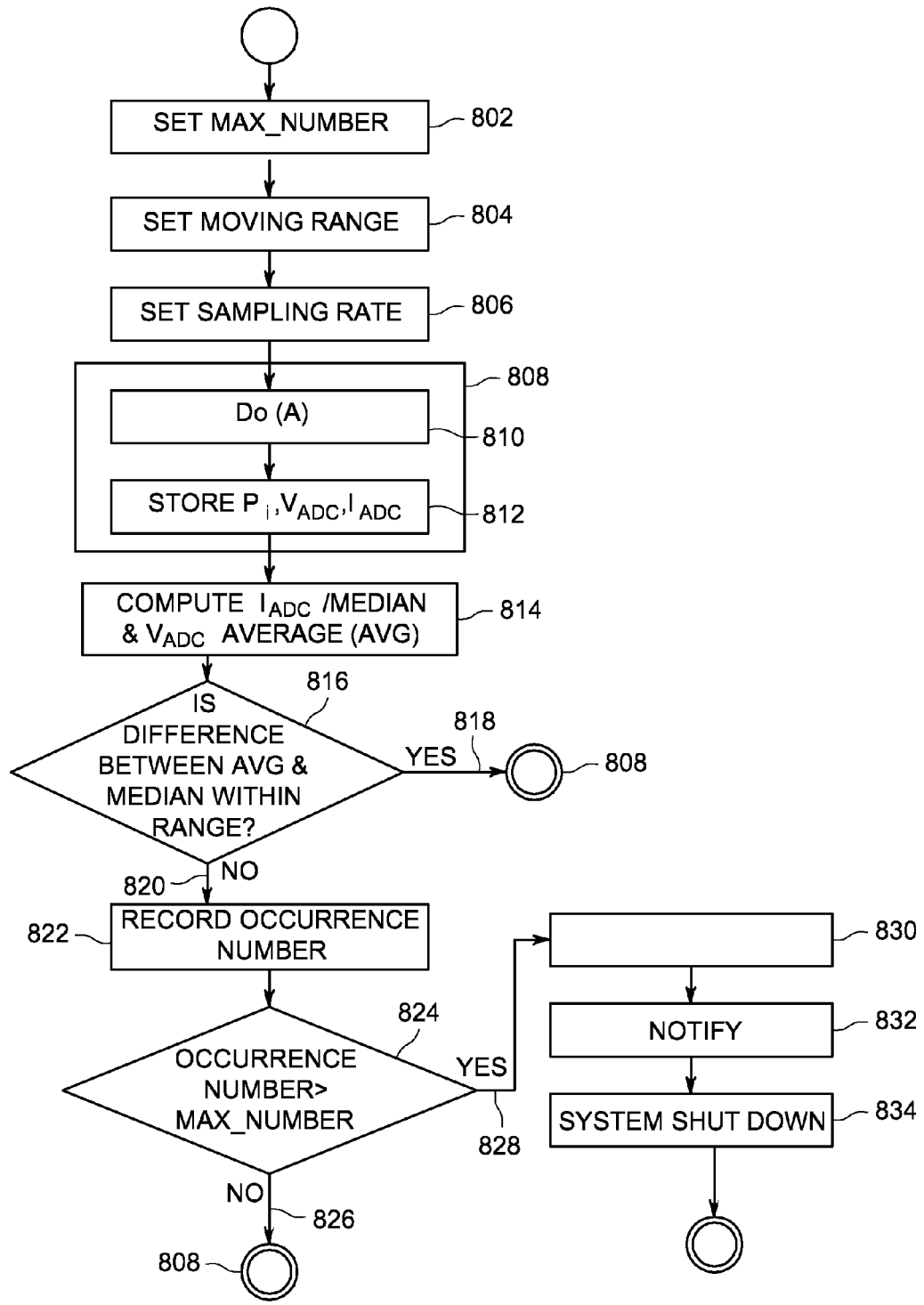
FIG. 8 is a flow chart illustrating one embodiment of determining voltage and current malfunction detections in a process incorporating aspects of the present disclosure.

FIG. 8 illustrates an exemplary process incorporating aspects of the disclosed embodiments that can be used to determine one or both of voltage and current exceptions. As illustrated in FIG. 8, a threshold number is set 802, referred to as MAX_NUMBER, which is the threshold number of exceptions or deviations from the set range that will be permitted before an abnormal situation is identified. Similar to the process described with respect to FIG. 5, the moving range is defined or set 804 as is the sampling rate 806.

The voltage ($V_{ADC}$), current ($I_{ADC}$) and power ($P_i$) values are calculated 808. In one embodiment, calculating 808 the consumed power ($P_i$) generally includes continuously sampling 810 the voltage and current while the power to the appliance 100 of FIG. 1 is on. The sampling 810 is iterated over one sampling period, and the voltage ($V_{ADC}$) and current ($I_{ADC}$) values are calculated as described with respect to FIG. 7. The calculated voltage ($V_{ADC}$) and current ($I_{ADC}$) values, together with the calculated power $P_i$ value, are stored 812.

In one embodiment, at the end of one sampling period, the average and median values of the calculated voltage ($V_{ADC}$) and/or current ($I_{ADC}$) is determined 814. It is then determined 816 whether the average and median values of the calculated voltage ($V_{ADC}$) and/or current ($I_{ADC}$) are within the pre-determined moving range, such as by comparing and determining the difference between the average and median values. If yes 818, the average and median values of the calculated voltage ($V_{ADC}$) and/or current ($I_{ADC}$) are within the pre-determined moving range, which is indicative of a normal voltage and/or current state. The voltage ($V_{ADC}$), current ($I_{ADC}$) and power ($P_i$) values continue to be calculated 808.

If the average and median values of the calculated voltage ($V_{ADC}$) and/or current ($I_{ADC}$) are not 820 within the predetermined moving range, the number of occurrences or deviations outside of the moving range are recorded 822. The number of occurrences is compared 824 to the MAX_NUMBER value. If the recorded number of occurrences is less 826 than the MAX_NUMBER, the voltage and/or current is within a normal range and the voltage ($V_{ADC}$), current ($I_{ADC}$) and power ($P_i$) values continue to be calculated 808.

If the recorded number of occurrences is greater than 828 the MAX_NUMBER, an abnormal voltage and/or current situation is identified 830. A notification or warning 832 can be provided to one or more of the user, a service center or the utility. In one embodiment, the appliance 100 can be powered down 834 in order to prevent any damage or malfunction.

FIG. 9 is a block diagram of the appliance 100 illustrated in FIG. 1. As is shown in FIG. 9, the appliance 100 generally includes a power supply 902, electro-mechanical devices and components 904, a controller 906 and a user interface 908. The power supply 902 can generally comprises any suitable power supply that receives electrical grip power from a utility 910, and converts the electrical power into a form suitable for use by the appliance 100. The electro-mechanical devices 904 generally comprise the components required for the operation of the appliance 100. In the case of an air conditioner, the electro-mechanical devices 904 can include fans and compressors. The controller 906 generally includes the electronic circuitry and components needed to control the operation of the appliance 100. In one embodiment, the controller 906 includes can also include a processor and a memory, where the processor is generally configured to execute program instructions stored in the memory. The controller 906 is generally configured to carry out and execute the processes described herein. In one embodiment, the controller 906 may also include software for executing the process steps and instructions described above. In one embodiment, software for executing the process described herein can be stored on or in and executed by one or more computers. The processor 906 can include computer readable code stored on a computer readable storage medium for carrying out and executing the process steps described herein. In one embodiment, the computer readable code is stored in a memory. In alternate embodiments, the controller 906 is comprised of machine-readable instructions that are executable by a processing device.

The controller 906 is generally configured to utilize program storage devices embodying machine-readable code that is adapted to cause the appliance 100 to perform and execute the method steps and processes disclosed herein. The program storage devices incorporating aspects of the disclosed embodiments may be devised, made and used as a component of a machine utilizing optics, magnetic properties and/or electronics to perform the procedures and methods disclosed herein. In alternate embodiments, the program storage devices may include magnetic media, such as a diskette, disk, memory stick or computer hard drive, which is readable and executable by a computer. In other alternate embodiments, the program storage devices could include optical disks, read-only-memory ("ROM") floppy disks and semiconductor materials and chips.

In one embodiment, the controller 906 may include and/or be coupled to one or more processor devices or computer systems (not shown) that are capable of sending information to each other and receiving information from each other. For example, the appliance 100 could be configured to communicate with a network, such as for example, a wireless area network or the Internet.

The user interface 908 allows the user to control the appliance 100, as well as receive information and notifications from the appliance 100. For example, the user interface 908 can include controls for adjusting the settings of the appliance 100. The user interface 908 can also include indicators, displays, and audio devices for presenting visual and aural information related to the operation and functions of the appliance 100 to the user.

The aspects of the disclosed embodiments provides for more accurate measurement of power consumption in a device. The accuracy of electric power measurement is enhanced by comparing the moving average and moving median of power consumed in a device. Electrical power consumption is measured in a steady power consumption state where the values of moving average power and the moving median power are converging on each other. In an unstable power consumption state, the aspects of the disclosed embodiments can calculate or estimate the power consumed using the power consumption values measured during the steady states. The aspects of the disclosed embodiments can also be used to monitor voltage and currents to determine power supply and hardware malfunctions.

Thus, while there have been shown, described and pointed out, fundamental novel features of the invention as applied to the exemplary embodiments thereof, it will be understood that various omissions and substitutions and changes in the form and details of devices illustrated, and in their operation, may be made by those skilled in the art without departing from the spirit of the invention. Moreover, it is expressly intended that all combinations of those elements and/or method steps, which perform substantially the same function in substantially the same way to achieve the same results, are within the scope of the invention. Moreover, it should be recognized that structures and/or elements and/or method steps shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

What is claimed is:

1. An apparatus for monitoring power consumption of an appliance, comprising:
   a processor in communication with a memory, the memory including program instructions for execution by the processor to:
   determine a first stable power consumption state of the appliance;
   record a power consumption of the appliance during the first stable power consumption state;
   determine an unstable power consumption state of the appliance;
   suspend recording of the power consumption of the appliance during the unstable state;
   determine a second stable power consumption state of the appliance;
   resume recording of the power consumption of the appliance when the appliance is in the second stable power consumption state; and
   estimate a value of a power consumed during the unstable power consumption state as a factor of the recorded power consumption of the appliance during the first stable power consumption state and the second stable power consumption power state.

2. The apparatus of claim 1, wherein the memory includes program instructions for execution by the processor to:

determine a first average power from the recorded power consumption of the appliance during the first stable power consumption state;

determine a second average power from the recorded power consumption during the second stable power consumption state;

determine an average of the first average power and the second average power; and estimate the power consumed during the unstable state by multiplying a duration of a time period of the unstable power consumption state by the average of the first average power and the second average power.

3. The apparatus of claim 2, wherein the memory includes program instructions for execution by the processor to:

mark a first time stamp when the unstable power consumption state is determined; and mark a second time stamp when the second stable power consumption state is determined, wherein a period between the first time stamp and the second time stamp defines the duration of the unstable state.

4. The apparatus of claim 1, wherein the memory includes program instructions for execution by the processor to determine the first stable power consumption state and the second stable power consumption state of the appliance by:

measuring power average and power median during a pre-determined period; and determining that an absolute value of a difference between the measured power average and power median remain within a pre-determined range of values during the pre-determined period.

5. The apparatus of claim 4, wherein the memory includes program instructions for execution by the processor to:

calculate a difference between the measured power average and the measured power median; and if the absolute value of the difference is outside of the pre-determined range of values, determining that the power consumption state is the unstable power consumption state.

6. The apparatus of claim 4, wherein the memory includes program instructions for execution by the processor to measure power average and power median during the pre-determined period by:

sampling voltage and current for a sampling period;

computing a power consumed based on the voltage and current sampled during the sampling period;

storing the computed power consumed during the sampling period; and repeating the sampling of voltage and current, computing of power consumed and storing of the computed power for subsequent sampling periods for a duration of the pre-determined period, wherein the measured power average and power median is based on the stored computed power for each of the sampling and subsequent sampling periods.

7. A method comprising:

determining a first stable power consumption state of the appliance;

recording a power consumption of the appliance during the first stable power consumption state;

determining an unstable power consumption state of the appliance;

suspending recording of the power consumption of the appliance during the unstable state;

determining a second stable power consumption state of the appliance;

resuming recording of the power consumption of the appliance when the appliance is in the second stable power consumption state; and automatically estimating a value of a power consumed during the unstable power consumption state as a factor of the recorded power consumption of the appliance during the first stable power consumption state and the second stable power consumption power state.

8. The method according to claim 7, further comprising:

determining a first average power from the recorded power consumption of the appliance during the first stable power consumption state;

determining a second average power from the recorded power consumption during the second stable power consumption state;

determining an average of the first average power and the second average power; and automatically estimating the power consumed during the unstable state by multiplying a duration of a time period of the unstable power consumption state by the average of the first average power and the second average power.

9. The method according to claim 8, further comprising:

marking a first time stamp when the unstable power consumption state is determined;

marking a second time stamp when the second stable power consumption state is determined; and defining a period between the first time stamp and the second time stamp as the duration of the unstable state.

10. The method according to claim 7, wherein determining the first stable power consumption state and the second stable power consumption state of the appliance further comprises:

measuring a power average and a power median of calculated power values during a pre-determined period; and determining that an absolute value of a difference between the measured power average and power median remain within a pre-determined range of values during the pre-determined period.

11. The method according to claim 8, further comprising:

determining a power average and a power median of calculated power values during a pre-determined period;

calculating a difference between the measured power average and the measured power median;

determining if an absolute value of the difference is within a pre-determined range of values, and if the absolute value of the difference is within the pre-determined range of values, determining that the power consumption state is a stable power consumption state.

12. The method according to claim 11, wherein if the absolute value of the difference is outside of the pre-determined range of values, determining that the power consumption state is an unstable power consumption state.

13. The method according to claim 11, wherein determining the power average and power median of the calculated power values during the pre-determined period comprises:

sampling voltage and current for a sampling period;

computing a power consumed based on the voltage and current sampled during the sampling period;

storing the computed power consumed during the sampling period; and repeating the sampling of voltage and current, computing of power consumed and storing of the computed power for subsequent sampling periods for a duration of the pre-determined period, wherein the measured power average and power median is based on the stored computed power for each of the sampling and subsequent sampling periods.

14. The method of claim 13, further comprising determining the unstable state when the absolute value of the measured power average and power median is outside of the pre-determined range of values during the pre-determined period.

15. An electrical appliance comprising:
- a current sensor for measuring the current supplied to the appliance;
- a voltage sensor for measuring the voltage applied to the appliance;
- a controller comprising a processor and a memory, the controller being in communication with the current sensor and the voltage sensor, the memory including program instructions for execution by the processor to:
  - process the inputs from the current and voltage sensors to calculate and record the instantaneous power consumption data for the appliance;
  - repetitively calculate the median and average power values from the instantaneous power consumption data over a predetermine interval;
  - calculate the difference between the median and average power values;
  - detect a stable power consumption state of the appliance when the difference is less than a predetermined threshold value; and to detect an unstable power consumption state when the difference is greater than the predetermined threshold value;
  - suspend recording of the power consumption data of the appliance upon detection of an unstable state;
  - resume recording of the power consumption data of the appliance when the appliance returns to a stable power consumption state; and
  - estimate a value of a power consumed during the unstable power consumption state as a function of the recorded power consumption of the appliance during the stable power consumption state first preceding the detection of an unstable state and the recorded power consumption of the appliance during the next detected stable power consumption power state.

* * * * *